S007741396B2

United States Patent
Tan et al.

(10) Patent No.: US 7,741,396 B2
(45) Date of Patent: *Jun. 22, 2010

(54) COMPOSITES HAVING TUNABLE DIELECTRIC CONSTANTS, METHODS OF MANUFACTURE THEREOF, AND ARTICLES COMPRISING THE SAME

(75) Inventors: Qi Tan, Rexford, NY (US); Patricia Chapman Irwin, Altamont, NY (US)

(73) Assignee: General Electric Company, Niskayuna, NY (US)

( * ) Notice: Subject to any disclaimer, the term of this patent is extended or adjusted under 35 U.S.C. 154(b) by 666 days.

This patent is subject to a terminal disclaimer.

(21) Appl. No.: 11/285,901

(22) Filed: Nov. 23, 2005

(65) Prior Publication Data

US 2007/0117898 A1     May 24, 2007

(51) Int. Cl.
| C08K 3/10 | (2006.01) |
| C04B 35/00 | (2006.01) |
| C01F 17/00 | (2006.01) |
| C01C 1/00 | (2006.01) |
| C01G 23/00 | (2006.01) |

(52) U.S. Cl. .................. 524/413; 501/134; 423/263; 423/594.1; 423/21.1; 423/71

(58) Field of Classification Search ............... 524/413; 501/134; 423/21.1, 71, 263, 594.1
See application file for complete search history.

(56) References Cited

U.S. PATENT DOCUMENTS

| 4,111,893 | A | * | 9/1978 | Gasman et al. ............. 523/213 |
| 4,913,935 | A | * | 4/1990 | Lin ............................ 427/221 |
| 5,169,551 | A | * | 12/1992 | Tsunooka et al. ....... 252/62.9 R |
| 5,650,031 | A | | 7/1997 | Bolon et al. |
| 5,962,122 | A | * | 10/1999 | Walpita et al. ............. 428/325 |
| 6,632,109 | B2 | | 10/2003 | Irwin et al. |
| 6,778,053 | B1 | | 8/2004 | Irwin et al. |
| 6,864,306 | B2 | | 3/2005 | Rao et al. |
| 7,465,497 | B2 | * | 12/2008 | Tan et al. .................... 428/403 |
| 2002/0040085 | A1 | * | 4/2002 | Venigalla et al. ........... 524/432 |
| 2003/0017351 | A1 | | 1/2003 | Hayashi et al. |
| 2003/0170893 | A1 | * | 9/2003 | Unger ........................ 435/455 |
| 2004/0060730 | A1 | * | 4/2004 | Lauf et al. .................. 174/255 |
| 2004/0063566 | A1 | | 4/2004 | Caspers et al. |
| 2004/0119055 | A1 | * | 6/2004 | Li et al. ........................ 252/500 |
| 2004/0122153 | A1 | * | 6/2004 | Guo et al. .................... 524/430 |
| 2004/0265551 | A1 | | 12/2004 | Takaya et al. |
| 2005/0080175 | A1 | | 4/2005 | Paik et al. |
| 2005/0161149 | A1 | | 7/2005 | Yokota et al. |
| 2005/0250890 | A1 | * | 11/2005 | Chen et al. .................. 524/425 |

FOREIGN PATENT DOCUMENTS

| WO | 0000267 | 1/2000 |
| WO | WO 01/89827 A1 | 11/2001 |
| WO | WO0184572 | * 11/2001 |
| WO | 02098818 | 12/2002 |
| WO | WO02098818 | * 12/2002 |

OTHER PUBLICATIONS

Dang et al "Dielectric Properties of LTNO ceramics and LTNO/PVDF Composites", Ceramics International, vol. 31, p. 349-351, available online Aug. 10, 2004. (3 pages total).*
Levinson, "Electronic Ceramics—properties, Devices, and Applications", Marcel Dekker, Inc, 1988, pp. 201 (3 pages total).*
Subramanian et al Jouran If solid State Chemistry, High Dielectric Constant in ACu3Ti4O12 and ACu3Ti3FeO12 Phases, vol. 151, pp. 323-325 (2000).*
Kingery et al, "Introduction of Ceramics", John Wiley & Sons, New York pp. 67 & 969-970 (1976) (5 pages total).*
Rao et al, "Material Chracterization of high Dielectric Constant polymer-Ceramic Composite for Embedded Cpacitor to RF Application", Active and Passive Electronic Components, 2002 vol. 25, pp. 123-129.*
TRS—Electrostrictors, p. 1.*
Yeh Wang "Compounding in Co-Rotating Twin-screw Extruders" Rapra Review reports, vol. 10, No. 8, p. 32 (2000).*
Richard J. Lewis, Sr. "Hawley's Condensed Chemical Dictionary, 13th Edition", John Wiley & Sons, Inc., New York pp. 703-704 (1997).*

(Continued)

*Primary Examiner*—Vasu Jagannathan
*Assistant Examiner*—Alexander C Kollias
(74) *Attorney, Agent, or Firm*—Ann M. Agosti

(57) ABSTRACT

Disclosed herein is a composition comprising a polymeric material; and non-linear dielectric ceramic fillers; wherein the non-linear dielectric ceramic fillers have a dielectric constant that is greater than or equal to about 100 and wherein the dielectric constant of the composition is tunable. Disclosed herein too is a composition comprising a polymeric material; and perovskites; wherein the dielectric constant of a composition is tunable and further wherein the composition has a dielectric constant of about 2 to about 100. Disclosed herein too is a method comprising blending a polymeric resin with non-linear dielectric ceramic fillers to form a composition; wherein the non-linear dielectric ceramic fillers have a dielectric constant of greater than or equal to about 100 and wherein the dielectric constant of the composition is tunable.

29 Claims, 1 Drawing Sheet

OTHER PUBLICATIONS

Meng et al "Preparation of Porous Ceramics by Gelcasting Approach", Material Letters vol. 45 pp. 224-227 (2000).*

Jha et al "Polymeric Citrate precursor route to the synthesis of the High Dielectric Constant Oxide, CaCu3Ti4O12", Material Letters vol. 57 pp. 244302446 (2003).*

Mark Alger, "Polymer Science Dictionary, 2nd Edition", Chapman & Hall, New York pp. 405, (1997).*

EP Search Report, EP06124499, Feb. 27, 2007.

JP58141222. Publication Date Aug. 22, 1983. "High-Dielectric Film". (Abstract Only).

Colin Kydd Campbell. "Experimental and Theoretical Characterization of an Antiferroelectric Ceramic Capacitor for Power Electronics". IEEE Transactions on Components and Packaging Technologies, vol. 25, No. 2, pp. 211-216, Jun. 2002.

Jianwen Xu and C.P. Wong[a]. "Low-loss percolative dielectric composite" Applied Physics Letters 87, 082907, pp. 082907-1,2,3, 2005.

Y. Bai, Z. —Y. Cheng, V. Gharti, H.S. Xu, and Q.M. Zhang[a]. "High-dielectric-constant ceramic-powder polymer composites" Applied Physics Letters, vol. 76, No. 25, pp. 3804-3806, published Apr. 28, 2000.

E. Aulagner, J. Guillet, G. Seytre, C. Hantouche, P. Le Gonidec, G. Terzulli. "(PVDF/BatiO$_3$) and (PP/BaTiO$_3$) Films for Energy Storage Capacitors" 1995 IEEE 5$^{th}$ International Conference on Conduction and Breakdown in Solid Dielectrics. pp. 423-427. 1995.

D. Dimos. "Perovskite Thin Films for High-Frequency Capacitor Applications[1]". Annual Review of Materials Science. vol. 28: 397-419 (Volume publication date Aug. 1998).

* cited by examiner

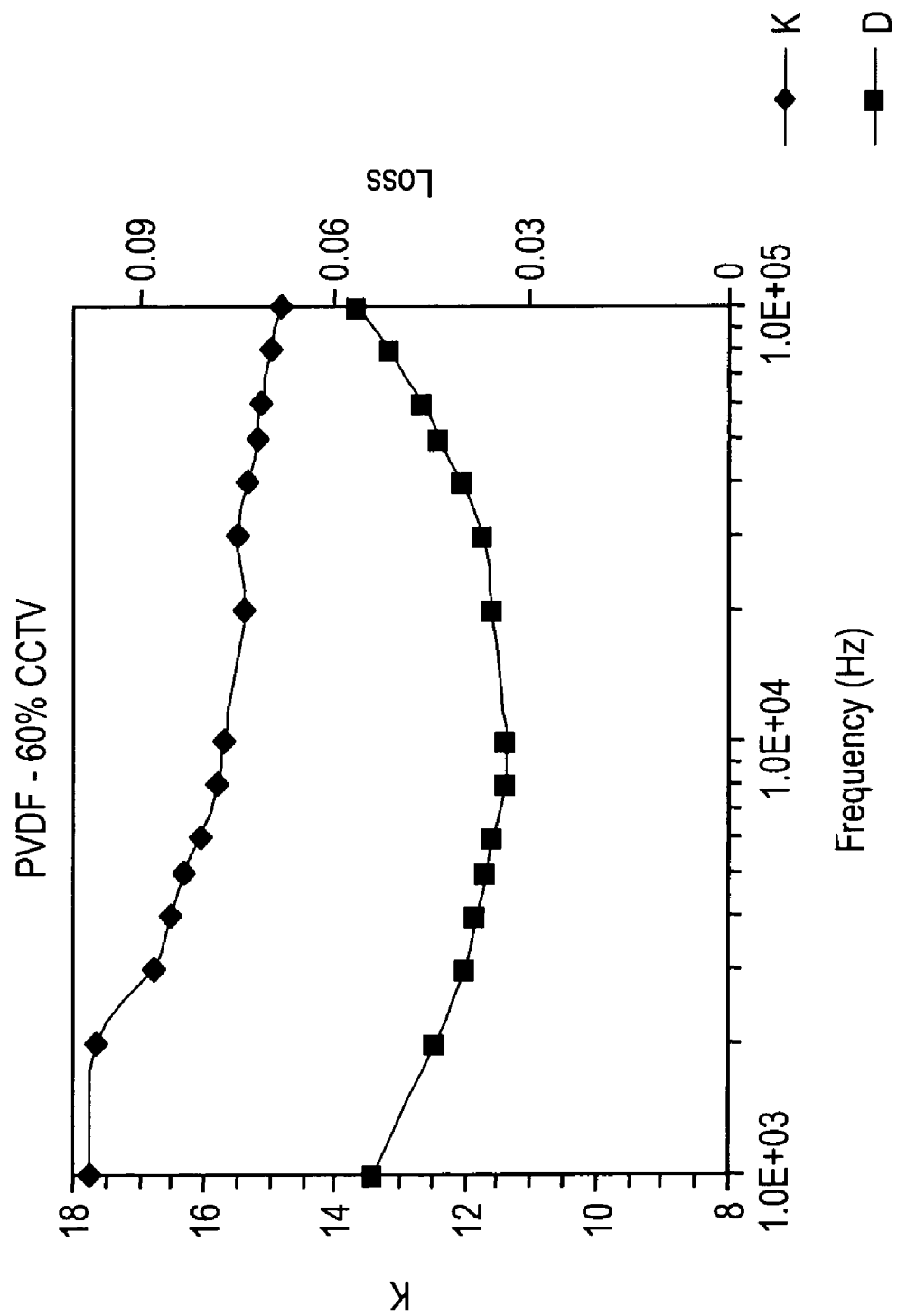

COMPOSITES HAVING TUNABLE DIELECTRIC CONSTANTS, METHODS OF MANUFACTURE THEREOF, AND ARTICLES COMPRISING THE SAME

BACKGROUND

This disclosure relates to composites having tunable dielectric constants, methods of manufacture thereof, and articles comprising the same.

The permittivity of ferroelectric materials is dependent upon the voltage at which it is measured. This voltage dependency makes the ferroelectric material potentially useful for tunable devices that operate at microwave frequencies. However, in order to function well at microwave frequencies, it is desirable for the ferroelectric materials to have low dielectric losses. In order to match the reactance of a varistor (that comprises a ferroelectric material) to the impedance of the rest of the circuit, it is desirable for the capacitance value of the ferroelectric material to be low at the microwave frequencies. The currently available ferroelectric materials however, all exhibit a very high capacitance value (i.e., they have high dielectric constants of greater than or equal to about 100).

In order to function successfully in high frequency applications (e.g., radio frequencies, microwave frequencies or higher), it is desirable to use materials that have a dielectric constant of less than or equal to 100. It is further desirable that these materials be tunable and have low dielectric losses in the radio frequency or microwave frequency range. A tunable material is one whose dielectric constant can be varied with frequency or with voltage. While there exist some low dielectric constant materials for radio frequency and microwave applications, these materials are not tunable. Other ferroelectric materials such as, for example, $CaCu_3Ti_4O_{12}$ are tunable over a broad frequency range but have high dielectric losses in their ceramic bulk state.

Materials that have a low capacitance value (e.g., a low dielectric constant) and that can be tuned directly by frequency or by an electrical field are not known. It is therefore desirable to manufacture materials that have a low dielectric constant and whose dielectric constants are capable of being tuned.

SUMMARY

Disclosed herein is a composition comprising a polymeric material; and non-linear dielectric ceramic fillers; wherein the non-linear dielectric ceramic fillers have a dielectric constant that is greater than or equal to about 100 and wherein the dielectric constant of the composition is tunable.

Disclosed herein too is a composition comprising a polymeric material; and perovskites; wherein the dielectric constant of the composition is tunable and further wherein the composition has a dielectric constant of about 2 to about 100.

Disclosed herein too is a method comprising blending a polymeric resin with non-linear dielectric ceramic fillers to form a composition; wherein the non-linear dielectric ceramic fillers have a dielectric constant of greater than or equal to about 100 and wherein the dielectric constant of the composition is tunable.

DETAILED DESCRIPTION OF THE FIGURES

The FIGURE is a graphical representation of the dependence of the dielectric constant (K) upon the frequency for a composite comprising polyvinylidene fluoride and a calcium-copper-titanium-oxide (CCTO).

DETAILED DESCRIPTION

It is to be noted that the terms "first," "second," and the like as used herein do not denote any order, quantity, or importance, but rather are used to distinguish one element from another. The terms "a" and "an" do not denote a limitation of quantity, but rather denote the presence of at least one of the referenced item. The modifier "about" used in connection with a quantity is inclusive of the stated value and has the meaning dictated by the context (e.g., includes the degree of error associated with measurement of the particular quantity). It is to be noted that all ranges disclosed within this specification are inclusive and are independently combinable.

Disclosed herein are compositions that comprise polymeric material and non-linear dielectric ceramic fillers, wherein the non-linear dielectric ceramic fillers have dielectric constants greater than or equal to about 100. The dielectric constant of the compositions are tunable either by the application of a biasing electric field (e.g., an electric field generated by a direct current) to the composition or by subjecting the composition to a frequency dependent electrical field (e.g., an electrical field generated by an alternating current or by radiation). The fillers have particle sizes in the nanometer range or in the micrometer range and can be dispersed in the polymeric material so as to produce a composition having improved mechanical properties with a dielectric constant of about 2 to about 100. This composition advantageously combines the nonlinear dielectric behavior of the ceramic fillers with the insulating property of polymers. The composition advantageously avoids the lossy grain boundary effects of the ceramic fillers. The composition can advantageously have its dielectric constant adjusted between 2 and 100 and can be used in applications that involve the use of radio frequencies, microwave frequencies and frequencies greater than microwave frequencies.

The polymeric material used in the compositions may be selected from a wide variety of thermoplastic polymers, thermosetting polymers, blends of thermoplastic polymers, or blends of thermoplastic polymers with thermosetting polymers. The polymeric material can comprise a homopolymer, a copolymer such as a star block copolymer, a graft copolymer, an alternating block copolymer or a random copolymer, ionomer, dendrimer, or a combination comprising at least one of the foregoing. The polymeric material may also be a blend of polymers, copolymers, terpolymers, or the like, or a combination comprising at least one of the foregoing.

Examples of thermoplastic polymers that can be used in the polymeric material include polyacetals, polyacrylics, polycarbonates, polyalkyds, polystyrenes, polyolefins, polyesters, polyamides, polyaramides, polyamideimides, polyarylates, polyurethanes, epoxies, phenolics, silicones, polyarylsulfones, polyethersulfones, polyphenylene sulfides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl alcohols, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polypropylenes, polyethylenes, polyethylene terephthalates, polyvinylidene fluorides, polysiloxanes, or the like, or a combination comprising at least one of the foregoing thermoplastic polymers.

Exemplary thermoplastic polymers include polyetherimide, polyvinylidene fluoride, polyvinylidine fluoride-trifluoroethylene P(VDF-TrFE), polyvinylidene-tetrafluoroethylene copolymers P(VDF-TFE), polyvinylidine trifluoroethylene hexafluoropropylene copolymers P(VDF-TFE-HFE) and polyvinylidine hexafluoropropylene copolymers P(VDF-HFE), epoxy, polypropylene, polyester, polyimide, polyarylate, polyphenylsulfone, polystyrene, polyethersulfone, polyamideimide, polyurethane, polycarbonate, polyetheretherketone, silicone, or the like, or a combination comprising at least one of the foregoing. An exemplary polymer is ULTEM®, a polyetherimide, commercially available from General Electric Plastics.

Examples of blends of thermoplastic polymers include acrylonitrile-butadiene-styrene/nylon, polycarbonate/acrylonitrile-butadiene-styrene, polyphenylene ether/polystyrene, polyphenylene ether/polyamide, polycarbonate/polyester, polyphenylene ether/polyolefin, or the like, or a combination comprising at least one of the foregoing.

Examples of thermosetting polymers that can be blended with the thermoplastic polymers are resins of epoxy/amine, epoxy/anhydride, isocyanate/amine, isocyanate/alcohol, unsaturated polyesters, vinyl esters, unsaturated polyester and vinyl ester blends, unsaturated polyester/urethane hybrid resins, polyurethane-ureas, reactive dicyclopentadiene (DCPD) resin, reactive polyamides, or the like, or a combination comprising at least one of the foregoing.

In one embodiment, suitable thermosetting polymers that can be blended with the thermoplastic polymers include thermosetting polymers that can be made from an energy activatable thermosetting pre-polymer composition. Examples include polyurethanes such as urethane polyesters, silicone polymers, phenolic polymers, amino polymers, epoxy polymers, bismaleimides, polyimides, and furan polymers. The energy activatable thermosetting pre-polymer component can comprise a polymer precursor and a curing agent. The polymer precursor can be heat activatable, eliminating the need for a catalyst. The curing agent selected will not only determine the type of energy source needed to form the thermosetting polymer, but may also influence the resulting properties of the thermosetting polymer. Examples of curing agents include aliphatic amines, aromatic amines, acid anhydrides, or the like, or a combination comprising at least one of the foregoing. The energy activatable thermosetting pre-polymer composition may include a solvent or processing aid to lower the viscosity of the composition for ease of extrusion including higher throughputs and lower temperatures. The solvent could help retard the crosslinking reaction and could partially or totally evaporate during or after polymerization.

The polymeric material may have a glass transition temperature of greater than or equal to about 150° C. In one embodiment, it is desirable for the polymeric material to have a glass transition temperature of greater than or equal to about 175° C. In another embodiment, it is desirable for the polymeric material to have a glass transition temperature of greater than or equal to about 200° C. In yet another embodiment, it is desirable for the polymeric material to have a glass transition temperature of greater than or equal to about 225° C. In yet another embodiment, it is desirable for the polymeric material to have a glass transition temperature of greater than or equal to about 250° C.

In one embodiment, the polymeric material is used in an amount of about 5 to about 99.999 wt % of the total weight of the composition. In another embodiment, the polymeric material is used in an amount of about 10 wt % to about 99.99 wt % of the total weight of the composition. In another embodiment, the polymeric material is used in an amount of about 30 wt % to about 99.5 wt % of the total weight of the composition. In another embodiment, the polymeric material is used in an amount of about 50 wt % to about 99.3 wt % of the total weight of the composition.

As noted above, the ceramic fillers have a dielectric constant greater than or equal to about 100. In one embodiment, it is generally desirable for the ceramic fillers have a dielectric constant greater than or equal to about 1,000. In another embodiment, it is generally desirable for the ceramic fillers have a dielectric constant greater than or equal to about 10,000. In yet another embodiment, it is generally desirable for the ceramic fillers have a dielectric constant greater than or equal to about 20,000.

Exemplary ceramic fillers are perovskites. Exemplary perovskites and perovskite derivatives include barium titanate ($BaTiO_3$), strontium titanate ($SrTiO_3$) barium strontium titanate, strontium-doped lanthanum manganate, lanthanum aluminum oxides ($LaAlO_3$), lanthanum strontium copper oxides (LSCO), yttrium barium copper oxides ($YBa_2Cu_3O_7$), lead zirconate titanate, lanthanum-modified lead zirconate titanate, or the like, combinations of lead magnesium niobate-lead titanate, or a combination comprising at least one of the foregoing perovskites and perovskite derivatives. Perovskites that exemplify the giant dielectric phenomenon such as, for example, calcium-copper-titanium-oxides (CCTOs) having the formula (I) can also be included:

$$ACu_3Ti_4O_{12} \tag{I}$$

where A is calcium (Ca) or cadmium (Cd).

In another embodiment, perovskites having the formula (II) can be included:

$$A'_{2/3}Cu_3Ti_3FeO_{12} \tag{II}$$

where A' is bismuth (Bi), yttrium (Y).

In yet another embodiment, perovskites termed lithium and titanium co-doped nickel oxide (LTNOs) having the general formula (III) can be included:

$$Li_xTi_yNi_{1-x-y}O \tag{III}$$

where x is less than or equal to about 0.3 and y is less than or equal to about 0.1.

Other examples of ceramic fillers having high dielectric constants include zirconates, titanates, aluminates, stannates, niobates, tantalates and rare earth oxides. Exemplary ceramic fillers include $Mg_2SiO_4$, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgZrO_3$, $CaZrO_3$, $BaZrO_3$, $SrZrO_3$, $BaSnO_3$, $CaSnO_3$, $MgSnO_3$, $Bi_2O_3/2SnO_2$, $MgNb_2O_6$, $SrNb_2O_6$, $BaNb_2O_6$, $MgTa_2O_6$, $BaTa_2O_6$, or the like, or a combination comprising at least one of the foregoing oxides. Exemplary metal oxides that have suitable dielectric constants include $Mg_2SiO_4$, $CaTiO_3$, $MgZrSrTiO_6$, $MgTiO_3$, $MgAl_2O_4$, $MgTa_2O_6$, $MgZrO_3$, or the like, or a combination comprising at least one of the foregoing inorganic oxides.

In one embodiment, the ceramic fillers can optionally be surface treated to facilitate bonding or adhesion with the polymeric material. In one embodiment, the surface treatment comprises coating the ceramic fillers with a silane-coupling agent. Examples of suitable silane-coupling agents include tetramethylchlorosilane, hexadimethylenedisilazane, gamma-aminopropoxysilane, or the like, or a combination comprising at least one of the foregoing silane coupling agents. The silane-coupling agents generally enhance compatibility of the ceramic fillers with the polymeric material and improve dispersion of the ceramic fillers within the polymeric material.

As noted above, the ceramic fillers have at least one dimension in the nanometer range ($10^{-9}$ meters). In one embodiment, it is desirable for the ceramic fillers to have an average largest dimension that is less than or equal to about 1,000 nm. The dimension may be a diameter, edge of a face, length, or the like. In one embodiment, the shape and geometry of the ceramic fillers can be the same as that of the substrate. In another embodiment, the shape and geometry of the ceramic fillers can be different from that of the substrate.

In another embodiment, the ceramic fillers can have micrometer sized dimensions ($10^{-6}$ meters). It is generally desirable to use ceramic fillers having particle sizes of up to about 10 micrometers. In one embodiment, it may be desirable to use ceramic fillers having particle sizes of up to about 5 micrometers. In another embodiment, it may be desirable to use ceramic fillers having particle sizes of up to about 2 micrometers. Nanometer sized and micrometer sized ceramic fillers can also be used together in a composition.

The ceramic fillers may have shapes whose dimensionalities are defined by integers, e.g., the ceramic fillers are either 1, 2 or 3-dimensional in shape. They may also have shapes whose dimensionalities are not defined by integers (e.g., they may exist in the form of fractals). The ceramic fillers may exist in the form of spheres, flakes, fibers, whiskers, or the like, or a combination comprising at least one of the foregoing forms. These ceramic fillers may have cross-sectional geometries that may be circular, ellipsoidal, triangular, rectangular, polygonal, or a combination comprising at least one of the foregoing geometries. The ceramic fillers, as commercially available, may exist in the form of aggregates or agglomerates prior to incorporation into the polymeric material or even after incorporation into the polymeric material. An aggregate comprises more than one particle in physical contact with one another, while an agglomerate comprises more than one aggregate in physical contact with one another.

Regardless of the exact size, shape and composition of the ceramic fillers, they may be dispersed into the polymeric material at loadings of about 0.0001 to about 50 wt % of the total weight of the composition when desired. In one embodiment, the ceramic fillers are present in an amount of greater than or equal to about 1 wt % of the total weight of the composition. In another embodiment, the ceramic fillers are present in an amount of greater than or equal to about 1.5 wt % of the total weight of the composition. In another embodiment, the ceramic fillers are present in an amount of greater than or equal to about 2 wt % of the total weight of the composition. In one embodiment, the ceramic fillers are present in an amount of less than or equal to 40 wt % of the total weight of the composition. In another embodiment, the ceramic fillers are present in an amount of less than or equal to about 30 wt % of the total weight of the composition. In another embodiment, the ceramic fillers are present in an amount of less than or equal to about 25 wt % of the total weight of the composition.

The polymeric material together with the ceramic fillers and any other optionally desired fillers may generally be processed in several different ways such as, but not limited to melt blending, solution blending, or the like, or a combination comprising at least one of the foregoing methods of blending. Melt blending of the composition involves the use of shear force, extensional force, compressive force, ultrasonic energy, electromagnetic energy, thermal energy or a combination comprising at least one of the foregoing forces or forms of energy and is conducted in processing equipment wherein the aforementioned forces are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or a combination comprising at least one of the foregoing.

Melt blending involving the aforementioned forces may be conducted in machines such as, but not limited to, single or multiple screw extruders, Buss kneader, Henschel, helicones, Ross mixer, Banbury, roll mills, molding machines such as injection molding machines, vacuum forming machines, blow molding machine, or then like, or a combination comprising at least one of the foregoing machines. It is generally desirable during melt or solution blending of the composition to impart a specific energy of about 0.01 to about 10 kilowatt-hour/kilogram (kwhr/kg) of the composition. Within this range, a specific energy of greater than or equal to about 0.05, preferably greater than or equal to about 0.08, and more preferably greater than or equal to about 0.09 kwhr/kg is generally desirable for blending the composition. Also desirable is an amount of specific energy less than or equal to about 9, preferably less than or equal to about 8, and more preferably less than or equal to about 7 kwhr/kg for blending the composition.

In one embodiment, the polymeric material in powder form, pellet form, sheet form, or the like, may be first dry blended with the ceramic fillers and other optional fillers if desired in a Henschel or a roll mill, prior to being fed into a melt blending device such as an extruder or Buss kneader. In another embodiment, the ceramic fillers are introduced into the melt blending device in the form of a masterbatch. In such a process, the masterbatch may be introduced into the melt blending device downstream of the polymeric material.

When a masterbatch is used, the ceramic fillers may be present in the masterbatch in an amount of about 10 to about 50 wt %, of the total weight of the masterbatch. In one embodiment, the ceramic fillers are used in an amount of greater than or equal to about 12.5 wt % of the total weight of the masterbatch. In another embodiment, the ceramic fillers are used in an amount of greater or equal to about 15 wt %, of the total weight of the masterbatch. In another embodiment, the ceramic fillers are used in an amount of greater than or equal to about 30 wt %, of the total weight of the masterbatch. In one embodiment, the ceramic fillers are used in an amount of less than or equal to about 45 wt %, of the total weight of the masterbatch. In another embodiment, the ceramic fillers are used in an amount of less than or equal to about 40 wt %, of the total weight of the masterbatch. In another embodiment, the ceramic fillers are used in an amount of less than or equal to about 35 wt %, of the total weight of the masterbatch. Examples of polymeric materials that may be used in masterbatches are polypropylene, polyetherimides, polyamides, polyesters, or the like, or a combination comprising at least one of the foregoing polymeric materials.

In another embodiment relating to the use of masterbatches in polymeric blends, it is sometimes desirable to have the masterbatch comprising a polymeric material that is the same as the polymeric material that forms the continuous phase of the composition. In yet another embodiment relating to the use of masterbatches in polymeric blends, it may be desirable to have the masterbatch comprising a polymeric material that is different in chemistry from other the polymers that are used in the composition. In this case, the polymeric material of the masterbatch will form the continuous phase in the blend.

The composition comprising the polymeric material and the ceramic fillers may be subject to multiple blending and forming steps if desirable. For example, the composition may first be extruded and formed into pellets. The pellets may then be fed into a molding machine where it may be formed into other desirable shapes. The samples can be injection molded, compression molded, blow molded, vacuum formed, or subjected to manufacturing processes that combine the aforementioned molding processes. Alternatively, the composition emanating from a single melt blender may be formed into sheets or strands and subjected to post-extrusion processes such as annealing, uniaxial or biaxial orientation.

Solution blending may also be used to manufacture the composition. The solution blending may also use additional energy such as shear, compression, ultrasonic vibration, or the like to promote homogenization of the ceramic fillers with the polymeric material. In one embodiment, a polymeric material suspended in a fluid may be introduced into an ultrasonic sonicator along with the ceramic fillers. The mixture may be solution blended by sonication for a time period effective to disperse the ceramic fillers within the polymeric material. The polymeric material along with the ceramic fillers may then be dried, extruded and molded if desired. It is generally desirable for the fluid to swell the polymeric material during the process of sonication. Swelling the polymeric material generally improves the ability of the ceramic fillers to impregnate the polymeric material during the solution blending process and consequently improves dispersion.

In another embodiment related to solution blending, the ceramic fillers are sonicated together with polymeric material precursors. Polymeric material precursors are generally monomers, dimers, trimers, or the like, which can be reacted into polymeric materials. A fluid such as a solvent may optionally be introduced into the sonicator with the ceramic fillers and the polymeric material precursor. The time period for the sonication is generally an amount effective to promote encapsulation of the ceramic fillers by the polymeric material precursor. After the encapsulation, the polymeric material precursor is then polymerized to form a polymeric material within which is dispersed the ceramic fillers.

Suitable examples of monomers that may be used to facilitate this method of encapsulation and dispersion are those used in the synthesis of polymers such as, but not limited to polyacetals, polyacrylics, polycarbonates, polystyrenes, polyesters, polyamides, polyamideimides, polyarylates, polyurethanes, polyarylsulfones, polyethersulfones, polyarylene sulfides, polyvinyl chlorides, polysulfones, polyetherimides, polytetrafluoroethylenes, polyetherketones, polyether etherketones, or the like, or a combination comprising at least one of the foregoing. In one embodiment, the mixture of polymeric material, polymeric material precursor, fluid and/or the ceramic fillers is sonicated for a period of about 1 minute to about 24 hours. In another embodiment, the mixture is sonicated for a period of greater than or equal to about 5 minutes. In another embodiment, the mixture is sonicated for a period of greater than or equal to about 10 minutes. In another embodiment, the mixture is sonicated for a period of greater than or equal to about 15 minutes. In one embodiment, the mixture is sonicated for a period of less than or equal to about 15 hours. In another embodiment, the mixture is sonicated for a period of less than or equal to about 10 hours. In another embodiment, the mixture is sonicated for a period of and more preferably less than or equal to about 5 hours.

Solvents may be used in the solution blending of the composition. The solvent may be used as a viscosity modifier, or to facilitate the dispersion and/or suspension of ceramic fillers. Liquid aprotic polar solvents such as propylene carbonate, ethylene carbonate, butyrolactone, acetonitrile, benzonitrile, nitromethane, nitrobenzene, sulfolane, dimethylformamide, N-methylpyrrolidone, or the like, or a combination comprising at least one of the foregoing solvents may be used. Polar protic solvents such as water, methanol, acetonitrile, nitromethane, ethanol, propanol, isopropanol, butanol, or the like, or a combination comprising at least one of the foregoing polar protic solvents may be used. Other non-polar solvents such benzene, toluene, methylene chloride, carbon tetrachloride, hexane, diethyl ether, tetrahydrofuran, or the like, or a combination comprising at least one of the foregoing solvents may also be used if desired. Co-solvents comprising at least one aprotic polar solvent and at least one non-polar solvent may also be used. In one embodiment, the solvent is xylene or N-methylpyrrolidone.

If a solvent is used, it may be utilized in an amount of about 1 to about 50 wt %, of the total weight of the composition. In one embodiment, if a solvent is used, it may be utilized in an amount of about 3 to about 30 wt %, of the total weight of the composition. In yet another embodiment, if a solvent is used, it may be utilized in an amount of about 5 to about 20 wt %, of the total weight of the composition. It is generally desirable to evaporate the solvent before, during and/or after the blending of the composition.

After solution blending, the solution comprising the desired composition can be cast, spin cast, dip coated, spray painted, brush painted and/or electrostatically spray painted onto a desired substrate. The solution is then dried leaving behind the composition on the surface. In another embodiment, the solution comprising the desired composition may be spun, compression molded, injection molded or blow molded to form an article comprising the composition.

Blending can be assisted using various secondary species such as dispersants, binders, modifiers, detergents, and additives. Secondary species may also be added to enhance one to more of the properties of the composition. Blending can also be assisted by pre-coating the ceramic fillers with a thin layer of the polymeric material or with a phase that is compatible with the polymeric material, such as, for example a silane layer.

A composition comprising a polymeric material and ceramic fillers has advantages over the polymeric material alone. In one embodiment, the composition has a dielectric constant that is at least 10% greater than a composition comprising polymeric material alone. In another embodiment, the composition has a dielectric constant that is at least 50% greater than the polymeric material alone. In another embodiment, the composition has a dielectric constant that is at least 100% greater than the polymeric material alone.

The composition also has a breakdown voltage that is advantageously greater than the polymeric material alone. In one embodiment, the composition has a breakdown voltage that is at least 150 Volts/micrometer (V/micrometer). The breakdown is generally determined in terms of the thickness of the composition. In another embodiment, the composition has a breakdown voltage that is at least 400 V/micrometer. In another embodiment, the composition has a breakdown voltage that is at least 500 V/micrometer.

The composition also has a corona resistance that is advantageously greater than the polymeric material alone. In one embodiment, the composition has a corona resistance that is resistant to a current of about 1000 volts to 5000 volts applied for about 200 hours to about 2000 hours. In another embodiment, the composition has a corona resistance that is resistant to a current of about 1000 volts to 5000 volts applied for about 250 hours to about 1000 hours. In yet another embodiment, the composition has a corona resistance that is resistant to a current of about 1000 volts to 5000 volts applied for about 500 hours to about 900 hours.

The composition has a dielectric constant greater than or equal to about 3 when measured at frequencies of about 100 to about $10^6$ hertz (Hz). In one embodiment, the composition has a dielectric constant greater than or equal to about 5 when measured at frequencies of about 100 to about $10^6$ hertz (Hz). In yet another embodiment, the composition has a dielectric constant greater than or equal to about 10 when measured at frequencies of about 100 to about $10^6$ hertz (Hz). In yet another embodiment, the composition has a dielectric constant greater than or equal to about 50 when measured at frequencies of about 100 to about $10^6$ hertz (Hz).

In another embodiment, the composition also has a Notched Izod impact strength of greater than or equal to about 5 kilojoules per square meter (kJ/m$^2$). In another embodiment, the composition has a Notched Izod impact strength of greater than or equal to about 10 kJ/m$^2$. In another embodiment, the composition has a Notched Izod impact strength of greater than or equal to about 15 kJ/m$^2$. In another embodiment, the composition has a Notched Izod impact strength of greater than or equal to about 20 kJ/m$^2$.

Compositions that comprise the ceramic fillers may also be optically transparent. In one embodiment, the compositions have a transmissivity to visible light of greater than or equal to about 70%. In another embodiment, the compositions have a transmissivity to visible light of greater than or equal to about 80%. In yet another embodiment, the compositions have a transmissivity to visible light of greater than or equal to about 90%. In yet another embodiment, the compositions have a transmissivity to visible light of greater than or equal to about 95%.

In yet another embodiment, the composition also has a Class A surface finish when molded. Molded articles can be manufactured by injection molding, blow molding, compression molding, or the like, or a combination comprising at least one of the foregoing.

As noted above, this composition is advantageous in that it has a dielectric constant of about 2 to about 100 while being tunable either by using a biasing electrical field or by using a frequency dependent electrical field. In other words the dielectric constant of the composition is tunable. An example of a biasing electrical field is an electric field generated by a direct current, while the frequency dependent electrical field is one that is generated by an alternating current. The composition advantageously has a very low dielectric loss factor. The composition can advantageously be used in capacitors, defibrillators, printed wiring boards, spark plug caps, components for spark plugs, or other articles.

The following examples, which are meant to be exemplary, not limiting, illustrate compositions and methods of manufacturing of some of the various embodiments of the nanocomposite compositions and the methods of manufacture described herein.

EXAMPLE

This example was performed to demonstrate the ability to tune the dielectric constant of a composition using a frequency instead of the voltage from a direct current electrical field that is commonly used in tunable capacitor devices. The polymeric material is polyvinylidene fluoride (PVDF) commercially available from Solvay Solexis Inc. The particles are calcium-copper-titanium-oxide (CCTO's) added in an amount of 60 wt %, based upon the weight of the composition. 0.25 grams of polyvinylidene fluoride (PVDF) was first dissolved in 153 grams of NMP solvent to form a polyvinylidene fluoride (PVDF) solution. The CCTO's were added to the PVDF solution. The films were cast onto a glass surface in a hood and allowed to dry at room temperature. The film thickness is 20 to 150 micrometers, which was sputter coated with platinum. The platinum establishes electrical contact with the electrodes of the dielectric analyzer. The composition films were subjected to dielectric constant tests at room temperature at a frequency of $10^3$ to $10^5$ Hz using a dielectric analyzer HP4285A manufactured by Hewlett Packard. The results are shown in the FIGURE. From the FIGURE it may be seen that as the frequency increases the dielectric constant (K) decreases. Thus this example demonstrates that for a given composition, the dielectric constant can be tuned by using the frequency of an alternating electrical field.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A composition comprising:
   a polymeric material; and
   perovskite fillers comprising copper-titanium-oxides having the formula (II):

   $$A'_{2/3}Cu_3Ti_3FeO_{12} \qquad (II)$$

where A' is bismuth or yttrium; wherein the perovskite fillers have a dielectric constant that is greater than or equal to about 1000; and wherein the dielectric constant of the composition is tunable by changing the frequency of an applied electrical field to the composition.

2. The composition of claim 1, wherein the perovskite fillers have a dielectric constant that is greater than or equal to about 10,000.

3. The composition of claim 1, wherein the polymeric material comprises a thermoplastic polymer, a thermosetting polymer, blends of thermoplastic polymers or blends of thermoplastic polymers with thermosetting polymers.

4. An article comprising the composition of claim 1.

5. A method of preparing a composition comprising:
   blending a polymeric resin with perovskite fillers comprising copper-titanium-oxides having the formula (II):

   $$A'_{2/3}Cu_3Ti_3FeO_{12} \qquad (II)$$

where A' is bismuth or yttrium; to form a composition; wherein the perovskite fillers have a dielectric constant of greater than or equal to about 1000 and wherein the dielectric constant of the composition is tunable by changing the frequency of an applied electrical field to the composition.

6. The method of claim 5, further comprising casting the composition.

7. The method of claim 5, further comprising molding the composition

8. The method of claim 5, wherein the molding comprises injection molding.

9. An article manufactured by the method of claim 5.

10. An article comprising the composition of claim 1.

11. The article of claim 10, wherein the article is a capacitor or a component for a spark plug.

12. The composition of claim 3, wherein the polymeric material comprises polyetherimide, polyvinylidene fluoride, polyvinylidine fluoride-trifluoroethylene P(VDF-TrFE), polyvinylidene-tetrafluoroethylene copolymers P(VDF-TFE), polyvinylidine trifluoroethylene hexafluoropropylene copolymers P(VDF-TFE-HFE) and polyvinylidine hexafluoropropylene copolymers P(VDF-HFE), epoxy, polypropylene, polyester, polyimide, polyarylate, polyphenylsulfone, polystyrene, polyethersulfone, polyamideimide, polyurethane, polycarbonate, polyetheretherketone, silicone, or blends thereof.

13. The composition of claim 12, wherein the polymeric material comprises a polyetherimide.

14. The composition of claim 12, wherein the polymeric material comprises a blend with a thermosetting polymer further comprising resins of epoxy/amine, epoxy/anhydride, isocyanate/amine, isocyanate/alcohol, unsaturated polyesters, vinyl esters, unsaturated polyester and vinyl ester blends, unsaturated polyester/urethane hybrid resins, polyurethane-ureas, reactive dicyclopentadiene (DCPD) resin, or reactive polyamides.

15. The composition of claim 3, wherein the polymeric material comprises a blend comprising acrylonitrile-butadiene-styrene/nylon, polycarbonate/acrylonitrile-butadiene-styrene, polyphenylene ether/polystyrene, polyphenylene ether/polyamide, polycarbonate/polyester, or polyphenylene ether/polyolefin.

16. The composition of claim 12, wherein the polymeric material comprises a blend with a thermosetting polymer made from an energy activatable thermosetting pre-polymer composition.

17. The composition of claim 16, wherein the energy activatable thermosetting pre-polymer composition comprises a polymer precursor and a curing agent.

18. The composition of claim 17, wherein the curing agent comprises one or more aliphatic amines, aromatic amines, acid anhydrides or combinations of these.

19. The composition of claim 1, wherein the perovskites fillers are surface treated.

20. The composition of claim 19, wherein the surface treatment comprises a silane coupling agent.

21. The composition of claim 1, wherein the perovskites fillers have an average largest dimension less than or equal to about 1000 nm.

22. The composition of claim 1, wherein the perovskites fillers are dispersed into the polymeric material at loadings of from about 0.0001 wt % to about 50 wt % based upon the total weight of the composition.

23. The method of claim 5, wherein the blending comprising solution blending or melt blending.

24. The method of claim 23, wherein prior to solution or melt blending, the polymeric material and perovskite fillers are dry blended.

25. The method of claim 23, wherein the perovskite fillers are introduced into a melt blending device in the form of a masterbatch.

26. The method of claim 25, wherein the masterbatch of perovskite fillers is introduced in the melt blending device downstream of the polymeric material.

27. The method of claim 25, wherein the perovskite fillers are present in the masterbatch in an amount of from about 10 wt % to about 50 wt % of the total weight of the masterbatch.

28. The method of claim 23, wherein the polymeric resin is suspended in a fluid and introduced into an ultrasonic sonicator with the perovskite fillers and subjected to sonication for a period of time sufficient for the fluid to swell the polymeric material.

29. The method of claim 28, wherein the fluid is present in an amount of from about 5 wt % to about 20 wt % of the total weight of the composition.

* * * * *